US005968596A

United States Patent [19]

Ma et al.

[11] Patent Number: 5,968,596

[45] Date of Patent: Oct. 19, 1999

[54] DIBORIDE COATED PRESSING SURFACES FOR ABRASION RESISTANT LAMINATE AND MAKING PRESSING SURFACES

[75] Inventors: Muyuan M. Ma, Round Rock; Jay T. Oliver, Belton, both of Tex.

[73] Assignee: Premark RWP Holdings, Inc., Wilmington, Del.

[21] Appl. No.: 09/026,166

[22] Filed: Feb. 19, 1998

Related U.S. Application Data

[62] Division of application No. 08/704,165, Aug. 28, 1996.

[51] Int. Cl.[6] .................................................... C23C 14/46

[52] U.S. Cl. ........................ 427/307; 204/192.1; 427/299

[58] Field of Search .................................... 427/307, 299; 204/192.1

[56] References Cited

U.S. PATENT DOCUMENTS

| | | | |
|---|---|---|---|
| 4,556,607 | 12/1985 | Sastri | 428/627 |
| 4,820,392 | 4/1989 | Moskowitz et al. | 204/192.11 |
| 4,971,855 | 11/1990 | Lex et al. | 428/206 |
| 5,244,375 | 9/1993 | Laurence et al. | 425/406 |

*Primary Examiner*—Archene Turner
*Attorney, Agent, or Firm*—J. M. (Mark) Gilbreth; Robert W. Strozier; Gilbreth & Strozier,P.C.

[57] ABSTRACT

A press plate for producing decorative laminate from resin impregnated paper, with alumina particles on its pressing surface, is coated with diborides selected from the group consisting of hafnium diboride, molybdenum diboride, tantalum diboride, titanium diboride, tungsten diboride, vanadium diboride, or zirconium diboride or mixtures thereof for making the press plate resistant to scratching. The preferred diborides are titanium and zirconium. The most preferred diboride is titanium. The color, gloss and surface appearance of laminate pressed with a titanium diboride coated press plate is substantially the same as laminate pressed with the press plate before coating.

12 Claims, No Drawings

DIBORIDE COATED PRESSING SURFACES FOR ABRASION RESISTANT LAMINATE AND MAKING PRESSING SURFACES

This is a division of application Ser. No. 08/704,165 filed Aug. 28, 1996.

BACKGROUND OF THE INVENTION

1. Field of the Invention

This invention relates to coated, abrasion resistant press plates used in making abrasion resistant decorative laminate, to the coating of press plates and to the making of laminate with these press plates. Grit, e.g., alumina particles, on the pressing surface of abrasion resistant decorative laminate can scratch press plates and reduce the visual quality of laminate thereafter made with the press plate. Press plates of this invention are particularly useful in making abrasion resistant high gloss decorative laminate.

2. Description of the Related Art

In the manufacture of decorative laminate, layers of resin impregnated paper are pressed against press plates under conditions of temperature and pressure to cure the resin and bond the layers together. A high gloss press plate imparts a high gloss surface to laminate. A textured surface imparts a textured surface to laminate. These press plates are extremely uniform, with even microscopic discontinuities being minimized. The quality of a high gloss polished press plate can be determined by viewing reflected images on its surface and scrutinizing the reflected images for optical discrepancies. Grit on the surface of laminate causes micro scratching of stainless steel press plates normally used in the manufacture of decorative laminate, thus destroying the micro finish of the press plate. Press plates can also be scratched by press plate handling equipment and by debris from pressing equipment or materials used in making laminate. (Laurence U.S. Pat. No. 5,244,375)

Melamine resin coated decorative laminate is pressed at temperatures of about 230–310° F. (110–155° C.) and pressures of about 300–2000 psi (20–136 bar) and preferably about 750–1500 psi (51–102 bar). Heating to these temperatures and cooling to room temperature results in substantial expansion and contraction of the laminate and of the press plate. Expansion and contraction of the laminate and press plate will not be the same, resulting in the movement of grit on the pressing surface of laminate across the press plate.

It is disclosed in National Electrical Manufacturers Association (NEMA) Standards Publication No. LD 3, that gloss finish laminate has a gloss of 70–100+. High gloss textured finish laminate is disclosed as having a gloss of 21–40. Black glass with a gloss of 94±1 degrees, measured at an angle of 60 degrees, is disclosed as the NEMA Standard 3.13.2, for calibrating a gloss meter for 60 degree angle gloss measurements.

Even discontinuities in high gloss press plates that can only be seen with a microscope can impart visible surface defects to a high gloss surface of laminate. Any scratching of high gloss press plates imparts visible surface defects to high gloss surfaces of laminate and reduce gloss level.

Grit on the decorative surface of laminate imparts abrasion resistance, a commercially desirable characteristic of laminate. Particles of alumina are commonly used as grit in making decorative laminate. The Vickers hardness of alumina is disclosed in "Tribology: Friction and wear of Engineering Materials", I. M. Hutchings, CRC Press, 1992, to be 1800 to 2000. A useful range of particle sizes is about 10 to about 75 microns. Grit of about 25–60 microns is preferred. Optimum abrasion resistance is obtained in the particle size range of about 40 to 60 microns. (Lane et. al. U.S. Pat. No. 3,798,111)

Alumina having a maximum particle size of 9 microns is disclosed as being effective for imparting a wear resistant surface to glossy decorative laminate. Wear resistance is defined as the resistance of a glossy laminate to loss of gloss when the surface of laminate is exposed to the abrasive effects of sliding objects. It is acknowledged that the resulting laminate does not meet NEMA LD 3.01 requirements to be considered as abrasion resistant. However, it is disclosed that glossy press plates are not scratched substantially if the grit particle size is maintained at less than 9 microns. (Lex et. al. U.S. Pat. No. 4,971,855)

The use of a 410 stainless steel press plate hardened by nitriding is disclosed for making high gloss decorative laminate. After pressing 100 sheets of high gloss laminate with 6 micron and 15 micron grit, the gloss of the pressed laminate remained good to very good. The nitrided press plate exposed to the 6 micron grit was rebuffed after 234 cycles and produced acceptable laminate quality for at least another 103 cycles. Nitrided press plates exposed to 30 micron grit offered limited durability. It is disclosed that the 410 stainless steel press plate used for nitriding had a Rockwell, "C" scale hardness of 38–45 and that the nitrided surface had a Rockwell, "C" scale hardness of 60–70. The equivalent Vickers hardness of 410 stainless steel is about 370–440, based on a conversion table published in "Metals Handbook, Mechanical Testing", Vol. 8, 9th ed., ASM. 1985. The equivalent Vickers hardness of nitrided 410 stainless steel is about 500–1000, based on a conversion table published in "Metals Handbook, Mechanical Testing", Vol. 8, 9th ed., ASM, 1985. (Laurence U.S. Pat. No. 5,244,375)

Laminate with 35 micron average particle size alumina at its surface (PGA 822 overlay, available commercially from Mead Corporation) has been pressed with high gloss press plates coated with titanium nitride. After ten pressings, the titanium nitride coated press plates had about 15 scratches per square centimeter. A control 410 stainless steel press plate had about 500 scratches per square centimeter. The Vickers hardness of titanium nitride is disclosed in "Tribology: Friction and wear of Engineering Materials", I. M. Hutchings, CRC Press, 1992, to be 1200 to 2000.

The control press plate and the press plate on which the titanium nitride was coated were cut from the same stainless steel pressing plate. The scratches was visible under a light microscope at 40× magnification. Titanium nitride was coated onto 410 stainless steel high gloss press plates in a magnetron sputter coating system. The use of a magnetron sputter coating system for applying a titanium nitride coating is disclosed in "Multi-Cathode Unbalanced Magnetron Sputtering Systems," Sproul, Surface and coating Technology, 49 (1991). The use of a magnetron sputter coating system for cleaning the surface that is to be coated is disclosed in "A New Sputter Cleaning System For Metallic Substrates," Schiller et. al., Thin Solid Films, 33 (1976).

Additionally, the color of the laminate pressed with the titanium nitride coated press plate was different than the color of the laminate pressed with the control press plate. An ASTM D 2244 color difference in comparison to a standard of less than (±0.5) ΔE is considered as an acceptable color match to the standard. The ASTM D 2244 color difference between a standard and laminate pressed with the titanium nitride coated press plate was greater than (0.5) ΔE. The titanium nitride coated press plate and laminate pressed therefrom had a bronze appearance. The control press plate and the laminate pressed therefrom did not have a bronze appearance. Laminate pressed with the control press plate had an ASTM D 2244 color difference when compared with the standard of less than (0.5) ΔE.

Iron-based cutting tools have been sputter coated with 2–6 microns of titanium diboride. The sputtering is carried out in an argon or krypton beam of ions accelerated to 1300–1800 volts as a broad-beam ion source. A titanium diboride target is arranged as a cathode. The tool is heated to about 200° C.(392° F.). Sputtering is done under a vacuum of about 4–6 milli-Torr. Titanium diboride has an extremely high Vickers micro-hardness value, typically about 3600, which is not only considerably higher than other borides but also substantially higher than other carbides or nitrides. Titanium diboride is also particularly noted for its high density, e.g., 88% of theoretical density, a low resistivity of 30 micro-ohms centimeters, a high strength of about 40,000 psi, and a coefficient of thermal expansion which is about $8.1\times10^{-6}$ at the temperature range of 20°–800° C. (68–1472° F.). (Moskowitz et al., U.S. Pat. No. 4,820,392)

Control conditions for sputter coating are disclosed in "Influence of Apparatus Geometry and Deposition Conditions on the Structure and Topography of Thick Sputtered Coatings" Thomton, Journal of Vacuum Science Technology, Volume 11, Number 4, (July/August 1974) and "Sputtering" Thomton et al., Metals Handbook, Ninth Edition, American Society for Metals, Metals Park, Ohio, 44073, Volume 5, pp 412–416, (1982).

There is a need for a hard coating on a press plates, continuous belt, and other pressing surfaces that imparts a color to laminate having an ASTM D 2244 color difference in comparison to a standard of less than (±0.5) ΔE. There is a need for a coating that can be applied to a pressing surface without changing the appearance of the finish on the pressing surface. There is a need for a pressing surface that is not scratched when used in pressing laminate coated with alumina particles of greater than 10 microns and preferably greater than 25 microns. There is a particular need for a pressing surface that is not scratched when used in pressing high gloss laminate with an ASTM 2457 60 degree angle gloss of greater than 70, when the surface of the laminate is coated with 25–60 micron alumina particles.

SUMMARY OF THE INVENTION

It has now been discovered that the color, gloss and surface appearance of laminate made with pressing surfaces coated with diborides selected from the group consisting of hafnium diboride, molybdenum diboride, tantalum diboride, titanium diboride, tungsten diboride. vanadium diboride, or zirconium diboride or mixtures thereof are substantially the same as the color and gloss of laminate made with the pressing surfaces before the coating is applied. The preferred diborides for coating laminate pressing surfaces are titanium diboride or zirconium diboride. The most preferred diboride for coating laminate pressing surfaces is titanium diboride. It is believed that titanium diboride is more commonly used commercially for coating surfaces than other members of the diborides of this invention because it can be sputter coated in a magnetron sputtering system at a higher deposition rate.

The diboride coating of this invention can be applied on laminate pressing surfaces to have a Vickers hardness of at least 2000 and preferably at least 2200, sufficient for pressing laminate with 25–60 micron or larger alumina particles at the pressing surface of the laminate without being scratched. A coating of about 3 microns has sufficient hardness to resist scratching by alumina particles on the pressing surface of laminate. The hardness of the coating can be controlled in a planar magnetron sputter coating system by those skilled in the use of these systems.

It has been discovered that the diboride coating of this invention can be coated on a pressing surface with sufficient bond strength for use in pressing high pressure laminate. A minimum bond strength of 1.6 and preferably 1.8 kilogram force (kgf) determined by diamond scratching bond testing is believed sufficient. Diboride coatings of greater than 6 microns can have lower bond strengths due to stresses produced during coating.

Bonding of the diboride coating of this invention to the pressing surface is enhanced by thoroughly cleaning the pressing surface before introducing the pressing surface into a magnetron sputter coating system. Bonding is further enhanced by etching the pressing surface with the magnetron sputter coating system prior to applying the titanium diboride coating. Cleaning, anodic etching, cathodic etching and etching with radio frequency (RF) can be accomplished by methods known to those skilled in the use of a magnetron sputter coating system. It has been discovered that a layer of titanium applied directly onto the pressing surface before applying the diboride coating of this invention further enhances the bonding of the diboride. Improving bonding by cleaning, etching and the use of an intermediate layer between the coating and substrate are known to those skilled in the art of using magnetron sputter coating systems.

DETAILED DESCRIPTION OF THE INVENTION

Black, high gloss, high pressure laminate was pressed with titanium diboride coated press plates shown on Table 1. These press plates had been finished for imparting an ASTM D 2457 60 degree angle gloss of about 100 to laminate before being coated with titanium diboride. The ASTM D 2244 color difference between a standard and laminate pressed with the titanium diboride coated press plates shown on Table 1 was less than (0.5) ΔE. Gloss and color differences on Table 1, are averages of measurements made on 10 laminates.

TABLE 1

Gloss and Color Differences

| Press Plate | ASTM Gloss @ 60° | ASTM Color Difference, ΔE |
|---|---|---|
| 3000-1 | 101 | 0.20 |
| 3000-2 | 100 | 0.25 |
| 6000-1 | 101 | 0.35 |
| 6000-2 | 103 | 0.40 |
| 6000-3 | 102 | 0.30 |
| 6000-4 | 102 | 0.40 |
| 6000-5 | 103 | 0.45 |
| 6000-6 | 101 | 0.45 |

Additionally, high gloss Press Plate 3000-2 and a control press plate have been used in the pressing of 760 sheets of high pressure, black, high gloss laminate with 35 micron average particle size alumina particles on its pressing surface. Laminate was pressed with these press plates at about 1000 psi (68 bar) and 280° F. (138° C.). The pressing surface of the laminate is commercially available overlay sheet with 35 micron alumina grit (PGA 822 from Mead). Press Plate 3000-2 and the control press plate were cut from a high gloss, 410 stainless steel press plate that had been finished for imparting an ASTM D 2457 60 degree angle gloss of about 100 to laminate. Press Plate 3000-2 and the control press plate measure about twelve inches along one side and eleven inches along their other side. Press Plate 3000-2 was coated with about five microns of titanium diboride in a magnetron sputter coating system. The titanium diboride coating was applied in 17 scans, applying about 3000 angstroms of titanium diboride per scan. The other was used as a control.

The first sheet of black, high gloss laminate with 35 micron average particle size alumina particles on its pressing surface pressed with the control press plate had an ASTM D 2244 color difference in comparison to a standard of about (0.25) ΔE. The first sheet of black, high gloss laminate pressed with Press Plate 3000-2 had an ASTM D 2244 color difference in comparison to a standard of about (0.15) ΔE.

The first sheet of black laminate pressed with the control press plate had an ASTM D 2457 60 degree angle gloss of about 100 to laminate. The 760th sheet of black laminate pressed with the control press plate had an ASTM D 2457, 60 degree angle gloss of less than 70. The control press plate imparted a 60 degree angle gloss of less than 90 to black laminate after it had pressed about 160 sheets. It is believed that laminate with a 60 degree angle gloss of less than 90 is not commercially acceptable as a high gloss laminate.

These 760 sheets of black laminate pressed with Press Plate 3000-2 had an ASTM D 2457 60 degree angle gloss of about 100. Press Plate 3000-2 has been viewed under a microscope for scratches after pressing these 760 sheets of black laminate and none have been found. The control press plate is heavily scratched.

No differences were observed in the surface appearance of laminate pressed with the Press Plates shown on Table 1 and control press plates.

Titanium diboride was coated onto the high gloss press plate in a magnetron sputter coating system under a number of conditions It is also believed that a coating of at least 3 microns is necessary for achieving a Vickers hardness of at least 2000 and that adhesion decreases at coating thicknesses of 6 microns or greater. Hardness and adhesion can be controlled, as known to those skilled in the art, by the pressure and temperature under which press plates are coated with the diborides of this invention and the power (amperes and volts) used in coating the diborides of this invention on press plates.

A textured press plate coated with titanium diboride, hereinafter "Press Plate 3000-3", and a control press plate been used in the pressing of greater than 450 sheets of high pressure, black, textured laminate with 35 micron average particle size alumina particles on its pressing surface. This laminate was pressed at about 1000 psi (68 bar) and 280° F. (138° C.). Press Plate 3000-3 and the control press plate were cut from a textured, 630 stainless steel press plate that had been finished for imparting an ASTM D 2457 60 degree angle gloss of about 10 to laminate. Press Plate 3000-3 and the control press plate measure about twelve inches along each side. Press Plate 3000-3 was coated with about six microns of titanium diboride in a magnetron sputter coating system. The titanium diboride coating was applied in 20 scans, applying about 3000 angstroms of titanium diboride per scan.

The first sheet of this black, textured laminate pressed with the control press plate had an ASTM D 2244 color difference in comparison to a standard of about (0.22) ΔE. Black, high gloss laminate pressed with Press Plate 3000-3 had an ASTM D 2244 color difference in comparison to a standard of about (0.08) ΔE.

The first sheet of this black laminate pressed with the control press plate had an ASTM D 2457, 60 degree angle gloss of about 9.5. The 450th sheet of this black laminate pressed with the control press plate had an ASTM D 2457, 60 degree angle gloss of about 8. This black laminate pressed with Press Plate 3000-3 had an ASTM D 2457, 60 degree angle gloss of about 10.

No differences were observed in the surface appearance of laminate pressed with the Press Plate 3000-3 and a control press plate.

The press plates on Table 1 and Press Plate 3000-3 were cleaned and then etched under radio frequency conditions in a planar magnetron sputter coating system. These press plates were then coated with titanium diboride in the magnetron sputter coating system under the following averaged conditions.

| | |
|---|---|
| Cleaning | |
| • chemical cleaning | wipe with ethanol, trichloroethane and acetone |
| • physical cleaning | 5 minute nitrogen gas blow over press plate |
| Radio Frequency Etching Conditions | |
| • gas medium | argon |
| • in./minute (cm./minute) scan speed | 1(2.54) |
| • mTorr | 10 |
| • mA/sq. in. (mA/sq. cm.) | 3.5(.54) |
| • kV | .75 |
| Titanium Diboride Coating Conditions | |
| • gas medium | argon |
| • in./minute (cm./minute) scan speed | 1(2.54) |
| • mTorr | 7 |
| • mA/sq. in. (mA/sq. cm.) | 83(13) |
| • kV | .3 |

Coating Conditions and Properties

| Press Plate | Scan Rate Å/scan | Scans | Thickness microns | Adhesion kgf | Hardness kgf |
|---|---|---|---|---|---|
| 3000-1 | 3000 | 14 | 4.2 | 1.7 | 2280 |
| 3000-2 | 3000 | 17 | 5.1 | 2.1 | 2830 |
| 3000-3 | 3000 | 20 | 5.5 | 2.0 | 2700 |
| 6000-1 | 6000 | 6 | 3.7 | 1.8 | 1940 |
| 6000-2 | 6000 | 6 | 3.7 | 1.8 | 2160 |
| 6000-3 | 6000 | 7 | 4.4 | 1.8 | 2250 |
| 6000-4 | 6000 | 7 | 4.3 | 2.0 | 2190 |
| 6000-5 | 6000 | 10 | 6 | 2.2 | 2880 |
| 6000-6 | 6000 | 10 | 6 | 2.0 | 2850 |

1 micron = 10,000 Å units

Three high gloss press plates, measuring about four feet by eight feet, of this invention have been made. These press plates are referred to as Press Plates 3-1, 3-2, and 3-3. These press plates were sputter coated with titanium diboride under planar magnetron discharge conditions.

Press Plates 3-1, 3-1, and 3-3 were anodically etched and then coated with titanium and titanium diboride in a planar magnetron sputter coating system under the following averaged conditions. These press plates were chemically cleaned before they were placed into the sputter coating system. The temperature of these press plates during etching and coating was about 300° F.(149° C.). These press plates did not warp at this temperature

| Cleaning (Press Plates 3-1, 3-2, and 3-3) | | | |
|---|---|---|---|
| • chemical cleaning | wipe with ethanol, trichloroethane and acetone (Press Plates | | |
| | 3-1, | 3-2, | 3-3) |
| Anodic Etching Conditions | | | |
| • gas medium | argon | argon | argon |
| • in./minute (cm./minute) scan speed | 3(7.6) | 3(7.6) | 3(7.6) |
| • mTorr | 25 | 24 | 10 |
| • mA/sq. in. (mA/sq. cm.) | 4.6(.72) | 2.9(.45) | 2.9(.45) |
| • kV | .24 | .23 | .24 |
| • number of scans | 1 | 1 | 5 |
| Titanium Coating Conditions | | | |
| • gas medium | argon | argon | argon |
| • in./minute (cm./minute) scan speed | 3(7.6) | 3(7.6) | 3(7.6) |
| • mTorr | 1.6 | 1.2 | 2.7 |
| • mA/sq. in. (mA/sq. cm.) | 70(11) | 70(11) | 70(11) |
| • kV | .52 | .52 | .43 |
| • number of Ti scans | 1 | 1 | 1 |
| Titanium Diboride Coating Conditions | | | |
| • gas medium | argon | argon | argon |
| • in./minute (cm./minute) scan speed | 3(7.6) | 3(7.6) | 3(7.6) |
| • mTorr | 1.6 | 1.2 | 2.7 |
| • mA/sq. in. (mA/sq. cm.) | 71(11) | 75(12) | 70(11) |
| • kV | .52 | .60 | .50 |
| • number of $TiB_2$ scans | 8 | 12 | 18 |
| • deposition rate (Å/scan) | 4125 | 5500 | 3000 |
| Properties of $TiB_2$/Ti Coating | | | |
| • thickness (microns) | 3.3 | 6.6 | 5.4 |
| • adhesion (kgf) | * | 1.2* | ** |
| • hardness (kgf) | 2000 | 2500 | ** |

*$TiB_2$/Ti coating separated from Press Plates 3-1 and 3-2 during the pressing of laminate.
** The hardness and adhesion of Press Plate 3-3 has not been measured. Hardness and adhesion testing destroys the surface of a press plate.

Press Plate 3-3 has been used in the pressing of greater than 1200 sheets of high pressure, black, high gloss laminate with 35 micron average particle size alumina particles on their pressing surfaces. Press Plates 3-3 was viewed for scratches after pressing these 1200 sheets of laminate and none have been found. The titanium diboride coating on Press Plates 3-1 and 3-2, separated from the stainless steel substrate after pressing less than 100 sheets of laminate.

A zirconium diboride coated high gloss press plate of this invention and a control press plate have each been used in the pressing of 10 sheets of black, high gloss laminate. This laminate had an ASTM D 2244 color difference in comparison to a standard of about (0.26) ΔE and an ASTM D 2457, 60 degree angle gloss of about 100. No differences were observed in the surface appearance of laminate pressed with the zirconium coated and control press plates.

A zirconium diboride coated high gloss press plate of this invention has been used in the pressing of 10 sheets of black, high gloss laminate with 35 micron average particle size alumina particles on its pressing surface. This laminate was pressed at about 1000 psi (68 bar) and 280° F. (138° C.). A commercially available overlay sheet with 35 micron alumina grit (PGA 822 from Mead) is the pressing surface of the laminate. No scratches were observed on this press plate after the pressing of these 10 sheets of laminate.

This zirconium diboride press plate was cut from a high gloss, 410 stainless steel press plate having an ASTM D 2457, that had been finished for imparting a 60 degree angle gloss of about 100 to laminate. Two press plates measuring about twelve inches along each side were cut from this press plate. One was coated with about five microns of zirconium diboride in a planar magnetron sputter coating system. This press plate was etched under radio frequency conditions for about 15 minutes before the titanium diboride coating was applied. A 6 micron zirconium diboride coating was applied in 15 scans, applying about 4,000 angstroms of zirconium diboride per scan in a planar magnetron sputter coating system under the following averaged conditions.

Cleaning chemical cleaning wipe with ethanol, trichloroethane and acetone physical cleaning 5 minute nitrogen gas blow over press plate

| Radio Frequency Etching Conditions | |
|---|---|
| • gas medium | argon |
| • in./minute (cm./minute) scan speed | 1(2.54) |
| • mTorr | 10 |
| • mA/sq. in. (mA/sq. cm.) | 3.5(.54) |
| • kV | .75 |
| Zirconium Diboride Coating Conditions | |
| • gas medium | argon |
| • in./minute (cm./minute) scan speed | 1(2.54) |
| • mTorr | 7 |
| • mA/sq. in. (mA/sq. cm.) | 56(9) |
| • kV | .4 |

Black, laminate has been pressed with press plates, measuring six inches by six inches (15.24 cm×15.24 cm), coated with titanium nitride in a magnetron sputter coating system. The test results shown on Table 3 are the average results of pressing five sheets of laminate with each press plate.

TABLE 4

Laminate Pressed With Titanium Nitride Coated Press Plates

| | control #8 | TiN #8 | control #9 | TiN #9 |
|---|---|---|---|---|
| ASTM Gloss @ 60° | 100 | 95 | 100 | 95 |
| ASTM Color Difference, ΔE | 0.30 | 0.75 | 0.35 | 0.90 |

The gloss of the laminate pressed with the titanium nitride coated press plate was lower than the gloss of laminate pressed with the control press plate. The color of the laminate pressed with the titanium nitride coated press plate was significantly different from the color of the laminate pressed with the uncoated control press plate. The titanium nitride coated press plates and laminate pressed with the titanium nitride press plates had a bronze appearance.

Black, laminate has been pressed with press plates, measuring six inches by six inches (15.24 cm×15.24 cm), coated with niobium nitride in a magnetron sputter coating system. The test results shown on Table 4 are the average results of pressing five sheets of laminate with each press plate.

TABLE 5

Laminate Pressed With Niobium Nitride Coated Press Plates

| Black, High Gloss Laminate | control | B3 (3 μm) | B5 (5 μm) |
|---|---|---|---|
| ASTM Gloss @ 60° | 106 | 102 | 101 |
| ASTM Color Difference, ΔE | 0.09 | 0.65 | 0.85 |

The gloss of laminate pressed with niobium nitride coated press plates was lower than the gloss of laminate pressed with the press plate before it was coated. The color of laminate pressed with the niobium nitride coated press plates was significantly different from laminate pressed with press plates before they were coated.

Black, laminate has been pressed with press plates, measuring six inches by six inches (15.24 cm×15.24 cm), coated with diamond like coating in a magnetron sputter coating system. The laminate stuck to the diamond like coated press plate and was destroyed when it was separated.

While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty that reside in the present invention, including all features that would be treated as equivalents thereof by those skilled the art to which this invention pertains.

We claim:

1. A method of making a planar pressing surface for producing decorative laminate from resin impregnated paper, comprising:

imparting a desired finish on a planar pressing surface;

removing contaminants from the planar surface; and coating the planar surface with diborides selected from the group consisting of hafnium diboride, molybdenum diboride, tantalum diboride, titanium diboride, tungsten diboride, vanadium diboride, or zirconium diboride or mixtures thereof in a planar magnetron sputter coating system to a Vickers hardness of at least 2000.

2. A method of making a planar pressing surface of claim 1, wherein the surface is coated with diborides in a planar magnetron sputter coating system to a Vickers hardness of at least 2200.

3. A method of making a planar pressing surface of claim 1, wherein the surface is coated with diborides selected from the group consisting of titanium diboride or zirconium diboride or mixtures thereof.

4. A method of making a planar pressing surface of claim 1, wherein the surface is coated with titanium diboride.

5. A method of making a planar pressing surface of claim 1, wherein the surface is first coated with titanium in a magnetron sputter coating system and then with diborides.

6. A method of making a planar pressing surface of claim 1, wherein the diboride coating has a thickness of at least 3 microns.

7. A method of making a planar pressing surface of claim 1, wherein the diboride coating has a thickness of not greater than 6 microns.

8. A method of making a press plate having planar pressing surfaces for producing decorative laminate from resin impregnated paper, comprising:

imparting a desired finish on the planar pressing surfaces;

removing contaminants from the pressing surfaces; and coating the planar surfaces with titanium diboride to a Vickers hardness of at least 2000.

9. A method of making a press plate of claim 8, wherein the planar surfaces are coated with titanium diboride in a planar magnetron sputter coating system to a Vickers hardness of at least 2200.

10. A method of making a press plate of claim 8, wherein the planar surfaces are first coated with titanium in a magnetron sputter coating system and then with titanium diboride.

11. A method of making a press plate of claim 8, wherein the titanium diboride coating has a thickness of at least 3 microns.

12. A method of making a press plate of claim 8, wherein the titanium diboride coating has a thickness of not greater than 6 microns.

* * * * *

UNITED STATES PATENT AND TRADEMARK OFFICE

CERTIFICATE OF CORRECTION

PATENT NO. : 5,968,596
DATED : October 19, 1999
INVENTOR(S) : Muyuan M. Ma, et al.

It is certified that error appears in the above-identified patent and that said Letters Patent is hereby corrected as shown below:

Column 1,
Line 52, replace "gloss of 94±1 degrees" with -- gloss of 94±1 --.
Line 54, replace "3.13.2 for calibrating" with -- 3.2.2 for calibrating --.

Column 2,
Line 11, replace "NEMA LD 3.01 requirements" with -- NEMA LD 3.13 requirements --.

Column 6,
Line 44, replace "{in table} Hardness kgf" with -- Hardness HV --.

Column 7,
Line 33, replace "{in table} hardness (kgf)" with -- hardness (HV) --.

Signed and Sealed this

Thirtieth Day of October, 2001

*Attest:*

Nicholas P. Godici

NICHOLAS P. GODICI

*Attesting Officer* — *Acting Director of the United States Patent and Trademark Office*

US005968596C1

(12) REEXAMINATION CERTIFICATE (4547th)

United States Patent

Ma et al.

(10) Number: US 5,968,596 C1

(45) Certificate Issued: Apr. 2, 2002

(54) DIBORIDE COATED PRESSING SURFACES FOR ABRASION RESISTANT LAMINATE AND MAKING PRESSING SURFACES

(75) Inventors: Muyuan M. Ma, Round Rock; Jay T. Oliver, Belton, both of TX (US)

(73) Assignee: Premark RWP Holdings, Inc., Wilmington, DE (US)

Reexamination Request:
No. 90/005,660, Mar. 2, 2000

Reexamination Certificate for:

| | |
|---|---|
| Patent No.: | **5,968,596** |
| Issued: | **Oct. 19, 1999** |
| Appl. No.: | **09/026,166** |
| Filed: | **Feb. 19, 1998** |

Certificate of Correction issued Oct. 13, 2001.

Related U.S. Application Data

(62) Division of application No. 08/704,165, filed on Aug. 28, 1996, now Pat. No. 5,945,214.

(51) Int. Cl.[7] .............................. B05D 3/04; B05D 3/00

(52) U.S. Cl. .................... 427/307; 204/192.1; 427/299

(58) Field of Search ................................ 427/299, 307; 204/192.1

(56) References Cited

U.S. PATENT DOCUMENTS

| | | | |
|---|---|---|---|
| 3,802,078 A | 4/1974 | Denes | 30/350 |
| 4,619,865 A | 10/1986 | Keem et al. | 428/333 |
| 5,182,256 A | 1/1993 | Itozaki et al. | 505/1 |
| 5,334,302 A | 8/1994 | Kubo et al. | 204/298.18 |
| 5,453,168 A | 9/1995 | Nelson et al. | 204/192.16 |
| 5,618,388 A | 4/1997 | Seeser et al. | 204/192.12 |
| 5,683,561 A | 11/1997 | Hollars et al. | 204/298.25 |

*Primary Examiner*—Archene Turner

(57) ABSTRACT

A press plate for producing decorative laminate from resin impregnated paper, with alumina particles on its pressing surface, is coated with diborides selected from the group consisting of hafnium diboride, molybdenum diboride, tantalum diboride, titanium diboride, tungsten diboride, vanadium diboride, or zirconium diboride or mixtures thereof for making the press plate resistant to scratching. The preferred diborides are titanium and zirconium. The most preferred diboride is titanium. The color, gloss and surface appearance of laminate pressed with a titanium diboride coated press plate is substantially the same as laminate pressed with the press plate before coating.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 1, lines 47–55:

It is disclosed in National Electrical Manufacturers Association (NEMA) Standards Publication No. LD 3, that gloss finish laminate has a gloss of 70–100+. High gloss textured finish laminate is disclosed as having a gloss of 21–40. Black glass with a gloss of 94±1 [degrees], measured at an angle of 60 degrees, is disclosed as the NEMA Standard [3.13.2] *3.2.2*, for calibrating a gloss meter for 60 degree angle gloss measurements.

Column 2, lines 5–15:

Alumina having a maximum particle size of 9 microns is disclosed as being effective for imparting a wear resistant surface to glossy decorative laminate. Wear resistance is defined as the resistance of a glossy laminate to loss of gloss when the surface of laminate is exposed to the abrasive effects of sliding objects. It is acknowledged that the resulting laminate does not meet NEMA LD [3.01] *3.13* requirements to be considered as abrasion resistant. However, it is disclosed that glossy press plates are not scratched substantially if the grit particle size is maintained at less than 9 microns. (Lex et. al. U.S. Pat. No. 4,971,855).

Column 6, lines 41–53:

Coating Conditions and Properties

| Press Plate | Scan Rate Å/scan | Scans | Thickness microns | Adhesion kgf | Hardness **[**kgf**]** *HV* |
|---|---|---|---|---|---|
| 3000-1 | 3000 | 14 | 4.2 | 1.7 | 2280 |
| 3000-2 | 3000 | 17 | 5.1 | 2.1 | 2830 |
| 3000-3 | 3000 | 20 | 5.5 | 2.0 | 2700 |
| 6000-1 | 6000 | 6 | 3.7 | 1.8 | 1940 |
| 6000-2 | 6000 | 6 | 3.7 | 1.8 | 2160 |
| 6000-3 | 6000 | 7 | 4.4 | 1.8 | 2250 |
| 6000-4 | 6000 | 7 | 4.3 | 2.0 | 2190 |
| 6000-5 | 6000 | 10 | 6 | 2.2 | 2880 |
| 6000-6 | 6000 | 10 | 6 | 2.0 | 2850 |

1 micron = 10,000 Å units

Column 7, lines 2–37:

| Cleaning (Press Plates 3-1, 3-2, and 3-3) | | | |
|---|---|---|---|
| chemical cleaning | wipe with ethanol, trichloroethane and acetone | | |
| Anodic Etching Conditions (Press Plates | 3-1, | 3-2, | 3-3) |
| gas medium | argon | argon | argon |
| in./minute (cm./minute) scan speed | 3(7.6) | 3(7.6) | 3(7.6) |
| mTorr | 25 | 24 | 10 |
| mA/sq. in. (mA/sq. cm.) | 4.6(.72) | 2.9(.45) | 2.9(.45) |

-continued

| | | | |
|---|---|---|---|
| kV | .24 | .23 | .24 |
| number of scans | 1 | 1 | 5 |
| Titanium Coating Conditions (Press Plates | 3-1, | 3-2, | 3-3) |
| gas medium | argon | argon | argon |
| in./minute (cm./minute) scan speed | 3(7.6) | 3(7.6) | 3(7.6) |
| mTorr | 1.6 | 1.2 | 2.7 |
| mA/sq. in. (mA/sq. cm.) | 70(11) | 70(11) | 70(11) |
| kV | .52 | .52 | .43 |
| number of Ti scans | 1 | 1 | 1 |
| Titanium Diboride Coating Conditions (Press Plates | 3-1, | 3-2, | 3-3) |
| gas medium | argon | argon | argon |
| in./minute (cm./minute) scan speed | 3(7.6) | 3(7.6) | 3(7.6) |
| mTorr | 1.6 | 1.2 | 2.7 |
| mA/sq. in. (mA/sq. cm.) | 71(11) | 75(12) | 70(11) |
| kV | .52 | .60 | .50 |
| number of $TiB_2$ scans | 8 | 12 | 18 |
| deposition rate (Å/scan) | 4125 | 5500 | 3000 |
| Properties of $TiB_2$/Ti Coating (Press Plates | 3-1, | 3-2, | 3-3) |
| thickness (microns) | 3.3 | 6.6 | 5.4 |
| adhesion (kgf) | * | 1.2* | ** |
| hardness **[**(kgf)**]** *(HV)* | 2000 | 2500 | ** |

*$TiB_2$/Ti coating separated from Press Plates 31 and 32 during the pressing of laminate.
**The hardness and adhesion of Press Plate 33 has not been measured. Hardness and adhesion testing destroys the surface of a press plate.

AS A RESULT OF REEXAMINATION, IT HAS BEEN DETERMINED THAT:

Claims 1 and 8 are determined to be patentable as amended.

Claims 2–7 and 9–12, dependent on an amended claim, are determined to be patentable.

New claims 13 and 14 are added and determined to be patentable.

1. A method of making a planar *decorative laminate* pressing surface for producing decorative laminate from resin impregnated paper, comprising:

imparting a desired finish on a planar pressing surface;

removing contaminants from the planar surface; and coating the planar surface with diborides selected from the group consisting of hafnium diboride, molybdenum diboride, tantalum diboride, titanium diboride, tungsten diboride, vanadium diboride, or zirconium diboride or mixtures thereof in a planar magnetron sputter coating system to a Vickers hardness of at least 2000 *such that the coated planar surface produces decorative laminate having color and gloss characteristics substantially similar to those of laminate produced with an uncoated pressing surface.*

8. A method of making a *decorative laminate* press plate having planar pressing surfaces for producing decorative laminate from resin impregnated paper, comprising:

imparting a desired finish on the planar pressing surfaces;

removing contaminants from the pressing surfaces; and coating the planar surfaces with titanium diboride to a Vickers hardness of at least 2000 *such that the coated planar surface produces decorative laminate having color and gloss characteristics substantially similar to those of laminate produced with an uncoated pressing surface*.

*13. The method according to claim 1, wherein the planar surface is coated to produce decorative laminate with an ASTM D 2244 color difference in comparison to a standard of less than (±0.5)ΔE.*

*14. The method according to claim 8, wherein the planar surface is coated to produce decorative laminate with an ASTM D 2244 color difference in comparison to a standard of less than (±0.5)ΔE.*

* * * * *